United States Patent
Bae et al.

(10) Patent No.: US 7,840,917 B2
(45) Date of Patent: Nov. 23, 2010

(54) METHOD OF CORRECTING A DESIGN PATTERN FOR AN INTEGRATED CIRCUIT AND AN APPARATUS FOR PERFORMING THE SAME

(75) Inventors: Choel-Hwyi Bae, Suwon-si (KR); Jin-Hee Kim, Seongnam-si (KR); You-Seung Jin, Seoul (KR); Dong-Hun Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 295 days.

(21) Appl. No.: 12/080,381

(22) Filed: Apr. 2, 2008

(65) Prior Publication Data
US 2008/0250361 A1    Oct. 9, 2008

(30) Foreign Application Priority Data
Apr. 5, 2007    (KR) ...................... 10-2007-0033636

(51) Int. Cl.
G06F 17/50    (2006.01)
(52) U.S. Cl. .............................. 716/1; 716/2
(58) Field of Classification Search ...................... 716/1, 716/2
See application file for complete search history.

(56) References Cited
U.S. PATENT DOCUMENTS

| | | | |
|---|---|---|---|
| 6,223,098 B1 | 4/2001 | Cheong et al. | |
| 6,988,259 B2 | 1/2006 | Pierrat et al. | |
| 2003/0097228 A1* | 5/2003 | Satya et al. | 702/82 |
| 2004/0064269 A1* | 4/2004 | Shibuya et al. | 702/40 |
| 2005/0157401 A1 | 7/2005 | Goehnermeier et al. | |
| 2006/0199286 A1* | 9/2006 | Sato | 438/14 |
| 2007/0143718 A1* | 6/2007 | Abercrombie et al. | 716/4 |
| 2007/0156379 A1* | 7/2007 | Kulkarni et al. | 703/14 |
| 2007/0288219 A1* | 12/2007 | Zafar et al. | 703/14 |

FOREIGN PATENT DOCUMENTS

| | | |
|---|---|---|
| KR | 1998-084031 | 12/1998 |
| KR | 10-2006-0024350 | 3/2006 |

\* cited by examiner

*Primary Examiner*—Jack Chiang
*Assistant Examiner*—Suchin Parihar
(74) *Attorney, Agent, or Firm*—Mills & Onello, LLP

(57) ABSTRACT

In an apparatus and method for automatically correcting a design pattern in view of different process defects, defect characteristic functions that indicate frequencies of each process defect independent from one another are generated, and a normalization factor that indicates relationships between the defect characteristic functions is determined. A general defect characteristic function indicating a frequency of general defects is generated using the defect characteristic functions and the normalization factor. The general defect causes the same process failure as caused by each of the process defects. The design pattern is modified using the general defect characteristic function in such a manner that the frequency of the general defects is minimized when at least one portion of the design pattern corresponding to the model pattern is transcribed on the substrate. Accordingly, the whole design pattern may be automatically corrected based on the general defect characteristic function.

23 Claims, 8 Drawing Sheets

METHOD OF CORRECTING A DESIGN PATTERN FOR AN INTEGRATED CIRCUIT AND AN APPARATUS FOR PERFORMING THE SAME

CROSS-REFERENCE TO RELATED APPLICATIONS

This application claims priority under 35 U.S.C. §119 to Korean Patent Application No. 2007-33636, filed on Apr. 5, 2007 in the Korean Intellectual Property Office (KIPO), the contents of which are herein incorporated by reference in their entirety.

BACKGROUND OF THE INVENTION

1. Field of the Invention

The present invention relates to a method of correcting a design pattern for an integrated circuit and apparatus for performing the same. More particularly, the present invention relates to a method of correcting a design pattern in which different process defects that are independent from one another are optimally minimized, and an apparatus for performing the same.

2. Description of the Related Art

In general, an integrated circuit device, such as a semiconductor device, is manufactured by a circuit design process for designing a transcription circuit pattern and a fabrication process for forming the integrated circuit on a semiconductor substrate in accordance with the transcription circuit pattern. For example, an electric circuit pattern, which is to be formed in a semiconductor device, is formed on a mask film in the circuit design process, and the circuit pattern on the mask film is formed on the substrate such as a wafer through various unit fabrication processes. Hereinafter, the electric circuit pattern which is to be transcribed onto the mask film will be referred to as a design pattern.

The design pattern is a theory-oriented and virtual circuit pattern for realizing some desired electric characteristics of an integrated circuit from a theoretical point of view. In contrast, a practical pattern on the wafer is a process-oriented and actual circuit pattern that is transcribed from the design pattern by various unit processes and processing techniques. Accordingly, the practical pattern is necessarily different from the design pattern, which is a mother pattern of the practical pattern in a transcription process. This difference is known as a process error. In practice, when the process error is allowable in a manufacturing process, the practical pattern is determined to be a non-defective pattern and when the process error is not allowable, the practical pattern is determined to be a defective pattern. The process error that is allowable in a manufacturing process is known as an allowable error, and the allowable error or an allowable error range is usually considered in the circuit design process.

As the degrees of integration of recent semiconductor integrated circuits have been increasing, the design rules, contact areas, critical dimensions, etc. of semiconductor devices have been continuously decreasing. As a result, incidents of process failures and poor operation of the semiconductor devices have been increasing, thereby reducing product yields of the semiconductor devices. Thus, research is being conducted so that the process failures are reflected in the circuit design pattern, to thereby increase the product yields of the semiconductor devices. A layout of the design pattern is usually modified and corrected in view of the process failures, and the concept including a series of processes for the modifications and corrections based on the process failures is widely known as "Design for Manufacturability (DFM)."

According to the DFM process, typical process defects causing the above process failures or the poor operation of the semiconductor devices are detected and are classified into groups in accordance with the process failures, and the circuit design process is performed in such a manner that the process defects are minimized in a manufacturing process to thereby minimize the process failures in a semiconductor device. For example, the DFM process usually includes the modification of the layout of the design pattern so as to minimize the process defects.

In general, the process defects detected in a manufacturing process for a semiconductor device are classified into three categories: random defects, systematic defects and parametric defects. The random defect is randomly generated during a manufacturing process due to surrounding conditions such as specific process conditions. The systematic defect is caused by an insufficient transcription of the layout of the design pattern onto a wafer. The parametric defect includes a kind of defect that is caused by the insufficient transcription of the layout to the wafer and that leads to poor operation of the semiconductor device but not process failures.

The random defect is an unexpected defect generated in each of unit processes of the manufacturing process for the semiconductor device, and exemplarily includes a particle, a void that is randomly generated in the unit process and electrical/physical defects due to the particle and/or the void. In contrast, the systematic defect is caused by inconsistency between the design pattern and the practical pattern, and thus is decisively influenced by average process accuracy or the size of the allowable error or the allowable error range of the process. For example, when the practical pattern is formed on the wafer with reduced critical dimensions (CD), in a process system of which the structural characteristics are the same as those of the system for the pattern having non-reduced CDs, the printability of the design pattern to the wafer may be degraded, and there is much more chance of the process failures occurring due to the degraded printability. As the degrees of integration of semiconductor devices increase, each unit process is required to be performed more accurately, thereby increasing possibility of systematic defects. The parametric defect is not detected as a process defect by an inspection process. However, the parametric defect has a decisive effect on the poor operation of a semiconductor device, to thereby cause the reduction of product yield of the device. The random and the systematic defects directly cause process failures and finally lead to a breakdown of the semiconductor device due to the processing defects. In contrast, the parametric defect does not cause process failures but degrades the performance of the semiconductor device as if the process failures are generated in the semiconductor device. For that reason, the random and the systematic defects may be classified as catastrophic defects, and the parametric defect may be classified as a performance defect. The above process defects are independent from one another and have individual effects on the process failures of the semiconductor device.

According to a conventional DFM process, a process engineer determines a critical parameter, which is a physical quantity of the practical pattern for minimizing the process failures, with respect to each type of the defects, respectively, by analyzing the practical patterns or using engineering intuition based on personal experience. Then, a design engineer makes a synthetic judgment based on all of the different kinds of process failures caused by each type of the defects and integrates the defects into a single kind of a conceptual process failure. The single kind of conceptual process failure by the design engineer is referred to as a general failure. Thereafter, the design engineer determines a conceptual parameter that decisively causes the general failure and a correction value of the conceptual parameter, which is a critical quantity for minimizing the general failures, using a design tool or personal experience. Finally, the design engineer modifies the layout of the design pattern, which is a mother pattern of the practical pattern, based on the correction value.

There may be difficulties in automating layout modification of the design pattern. Since the types of process defects are independent from one another and have individual effects on the process failures, an individual modification of the design pattern for minimizing process failures caused by each type of defect may be easily automated. However, a modification of the design pattern for minimizing the general failures may be difficult to automate because each type of defect is independent from the others, and no common process parameter is found between each type of defect.

When a skilled process engineer gives some information on correction specifications and correction locations of a sample cell on a wafer to which a particular unit process has been performed, a design engineer extends the correction information to overall cells of the wafer, so that the design pattern that is to be transcribed onto the entire surface of the wafer is modified based on the correction marks and correction locations corresponding to the sample cell. Accordingly, when the modified layout of the design pattern is transcribed onto a wafer, the process defects detected by the process engineer are sufficiently prevented at all cells of the wafer, to thereby remarkably increase the product yield of the semiconductor device. For example, the skilled process engineer may give some information on correction specifications and correction locations of a sample cell on a wafer in view of an overlap margin between a contact and an active region, an overlap margin between a bit line and a contact, or a correction margin for optical proximity. Particularly, the process engineer prepares a manual including specifications on each defect, the correction locations and correction order among the locations, and gives the manual to the design engineer. The random defect, the systematic defect and the parametric defect are individually analyzed by the process engineer, and the correction specifications and locations of each defect are independently applied to the modification of the layout of the design pattern.

Recently, various DFM tools are used for analyzing the defects in sample cells due to various sizes and kinds of the sample cells and a large number of defects in the sample cell. Particularly, some of the DFM tools can automatically give some information on yield increase before and after modification of the layout of the design pattern as well as information on correction locations and the corrected defect, to thereby improve the efficiency and accuracy of the DFM process. For example, a critical area analysis (CAA) device has been widely used as the DFM tool for analyzing a critical area for detecting the random defect. In addition, a critical feature analysis (CFA) device has been widely used as the DFM tool for analyzing critical features of a specific processing characteristic that usually causes a systematic defect. The printability of a layout of the design pattern may be visually shown using a litho-friendly design (LFD) device, and thus the LFD device has been widely used as the DFM tool for the parametric defect. The above DFM tools may automatically provide the correction specifications and the correction locations in accordance with each type of defect.

However, there are many difficulties in identifying correlations between the types of defects, because each type of defect has different properties. For example, physical dimensions of the catastrophic defect are different from those of the performance defect. Accordingly, each of the above DFM tools automatically gives a characteristic function of each type of defect, respectively, and the skilled process engineer provides correction specifications and locations of the sample cell in accordance with each type of defect. Then, the skilled design engineer manually modifies the layout of the design pattern with respect to a library cell based on the characteristic functions and the correction specifications and locations of the sample cell.

FIG. 1 is a graph illustrating a characteristic function of each type of defect generated by a conventional DFM tool. In FIG. 1, Curve I is a random defect characteristic function generated by the CAA device, and Curve II is a parametric defect characteristic function generated by the LFD device. In addition, the horizontal axis indicates a process parameter for generating the processing defect, and the vertical axis indicates a physical quantity of the processing defects.

For example, when the modification of the layout of the design pattern is directed to optimizing gap distances within circuit patterns or an allowable processing error, the process parameter may include a gap distance between specific structures of the design pattern or a distance from a specific pattern. The gap distance between specific structures of the design pattern may function as a process parameter for both the random defect characteristic function and the parametric defect characteristic function, so that the horizontal axis in FIG. 1 indicates a gap distance of the design pattern.

The random defect is expressed as a relative size of the defects with respect to the entire cell size, and the parameter defect is expressed as a specific physical quantity indicating a performance decrease of a semiconductor device, so that the random defect is expressed as a percentage indicating a defect ratio, and the parametric defect is expressed as a specific physical dimension, such as a current intensity, a voltage, a sheet resistance or a capacitance. The vertical axis in FIG. 1 may indicate the defect ratio or the specific physical quantity. Curve I and Curve II are interpreted by the skilled process engineer, and the interpretation results are provided to the design engineer. The design engineer modifies the layout of the design pattern based on the interpretation results and personal experience, and generates an optimal layout of the design pattern for optimally minimizing the random and parametric defects simultaneously. If a normalizing parameter between the two independent defects of the percentage of defects and the physical quantity, such as a voltage, current, etc., is not suggested in the modification process by the design engineer, the modification process for minimizing both of the independent defects simultaneously necessarily depends on the personal experience of the design engineer. That is, the modification process to the design pattern may be difficult to automate due to personal factors in the modification process. Until now, the layout modification to the design pattern for the library cell in the wafer has been performed based on the interpretation results and the personal experience of the design engineer.

However, the conventional manual DFM process has problems of inconsistency and omission of the corrections due to the personal factors of the DFM process. In addition, when the modified layout of the design pattern is provided back to the process engineer for review in view of processing technologies (DFM review), there have been no common criteria for checking the modification between the process and design engineers, so that the DFM review by the process engineer is also dependent on the personal experience of the process engineer.

Accordingly, there is still a need for an automated DFM process for increasing correction consistency and reducing modification time when the design pattern needs to be corrected for optimally minimizing at least two independent defects simultaneously.

SUMMARY OF THE INVENTION

Accordingly, the present invention provides a method of automatically correcting a layout of a design pattern for simultaneously minimizing different kinds of defects.

The present invention also provides an apparatus for the above method of automatically correcting the layout of the design pattern.

According to one aspect, the present invention is directed to a method of correcting a design pattern for an integrated circuit. A plurality of sample cells is selected from a plurality of practical patterns on a substrate. The practical patterns are transcribed onto the substrate from a design pattern. The practical patterns are stored in accordance with process failure types, and each of the process failure types is characterized by a model pattern. A plurality of defect characteristic functions is generated by analyzing the practical patterns in accordance with the process failures. The defect characteristic function indicates a frequency of each of the defects that are independent from one another and cause the process failures. A normalization factor that indicates a correlation between the defect characteristic functions is determined by mathematical operations. A general defect characteristic function is generated by using the defect characteristic functions and the normalization factor. The general defect characteristic function indicates a frequency of general defects that causes the same process failure as caused by each of the defects. The design pattern is modified in such a manner that the frequency of the general defects is minimized when at least one portion of the design pattern corresponding to the model pattern is transcribed on the substrate.

In an example embodiment, the sample cells are selected by defining an inspection area of a library cell on the substrate. The library cell includes a plurality of cells formed on an effective area of the substrate as an operation unit of the integrated circuit.

In an example embodiment, the practical patterns are stored in accordance with the process failure types as follows: the practical patterns of the sample cells are compared with the model pattern of each of the process failure units, and the practical patterns are grouped in accordance with the model pattern of which a layout is substantially identical to that of the practical pattern.

In an example embodiment, the process failure includes an insufficient overlap between contact members, a leakage current from a gate electrode, a parasitic capacitance at a capacitor, an electrical short at a conductive line and a void in an insulation interlayer, and the layout of the model pattern is inferred from empirical data on relationships between the process failures and the layout of the practical pattern. The practical patterns may be analyzed by an apparatus for performing a design for manufacturability (DFM) process with respect to each of the process failure types, respectively.

In an example embodiment, generating the defect characteristic functions includes: selecting a physical quantity of the defects that have a decisive effect on the process failure as a process characteristic parameter; obtaining a discrete distribution of each of the defects is obtained with respect to the process characteristic parameter of the practical pattern; and inferring a continuous function from the discrete distribution of each of the defects by a statistical inference process, respectively, to thereby generate the defect characteristic functions having the process characteristic parameter as an independent variable with respect to each of the defects. For example, the process characteristic parameter may include a gap distance between structures on the substrate or an allowable error range in a unit process for manufacturing the integrated circuit.

In an example embodiment, determining the normalization factor includes: selecting one of the defect characteristic functions as a reference function and remaining functions except for the reference function as fitting functions; inserting a pattern correction index is inserted into the process characteristic parameter, the pattern correction index being determined by the layout of the model pattern; calculating a ratio of each of fitting values with respect to a reference value, the fitting values indicating functional values of each of the fitting functions at the pattern correction index and the reference value indicating functional values of each of the fitting functions at the pattern correction index; and storing each ratio of the fitting values with respect to the reference value as the normalization factor of each of the fitting functions. For example, the pattern correction index may include a numerical value of the process characteristic parameter of the model pattern that minimizes the frequency of the general defects. In an example embodiment, generating the general defect characteristic function includes: obtaining a normalized function in relation to each of the fitting functions by multiplying each fitting function by the normalization factor, and arithmetically summing the normalized function and the reference function.

In an example embodiment, modifying the design pattern includes: selecting a portion of the design pattern of which a layout is substantially identical to that of the model pattern as an object pattern that is to be corrected; detecting a numerical value of the process characteristic parameter from the object pattern as a process characteristic value of the object pattern; calculating an actual defect frequency indicating a functional value of the general defect characteristic function at the process characteristic value and an optimal defect frequency indicating a functional value of the general defect characteristic function at the pattern correction index; comparing the actual defect frequency with the optimal defect frequency; and modifying the object pattern in such a manner that the difference between the actual defect frequency and the optimal defect frequency is minimized when the object pattern is transcribed onto the substrate.

In an example embodiment, the independent defects include a random defect that is randomly caused according to variation of process environments, a systematic defect caused by an insufficient transcription of the design pattern, and a parametric defect due to a performance decrease of the integrated circuit by the insufficient transcription of the design pattern. For example, the frequency of the random defects and the systematic defects is represented as a percentage, and the parametric defect is represented by a dimension of a current intensity and a voltage.

In one embodiment, the apparatus for performing the DMF process includes a critical area analysis (CAA) device for generating a random defect characteristic function, a critical feature analysis (CFA) device for generating a systematic defect characteristic function and a litho-friendly design (LFD) device for generating a parametric defect characteristic function.

According to another aspect, the present invention is directed to an apparatus for correcting a design pattern for an integrated circuit. The apparatus includes an analysis unit, a criteria generation unit, a modification unit and a control unit.

The analysis unit generates a plurality of defect characteristic functions indicating frequencies of each of the defects that are independent from one another by analyzing a plurality of sample cells including a plurality of practical patterns on a substrate. The practical patterns are transcribed onto the substrate from a design pattern and are sorted in accordance with process failure types. Each of the process failure types is characterized by a model pattern. The criteria generation unit generates a general defect characteristic function indicating a frequency of general defects that causes the same process failure as caused by each of the defects by processing the independent defect characteristic functions. The modification unit modifies the design pattern based on the general defect characteristic function. The control unit electrically controls the analysis unit, the criteria generation unit and the modification unit to minimize the frequency of the general defects.

In an example embodiment, the analysis unit includes a sampler for selecting sample cells including the practical patterns from the substrate that are transcribed from the design pattern, a sorting member for sorting the practical patterns in accordance with failure types, each of which corresponds to a model pattern having a characteristic layout, respectively, and a function generator for generating the defect characteristic functions with respect to the defects that are independent from one another by analyzing the practical patterns that are sorted by the sorting member in accordance with the failure types. For example, the sorting member may include a primary storage section for storing the model patterns and a supplementary storage section for the storing the practical pattern in accordance with the process failures.

In an example embodiment, the function generator includes a parameter input section for inputting numerical values of a process characteristic parameter as a process characteristic value that has a critical effect on the process defect, an analyzer for obtaining the frequency of each of the process defects, respectively, in accordance with the process failure types, and an inference operator for generating each of the defect characteristic functions based on the relations between the process characteristic parameter and each of the process defects by a statistical inference process. For example, the analyzer may include a critical area analysis (CAA) device for generating a random defect characteristic function, a critical feature analysis (CFA) device for generating a systematic defect characteristic function and a litho-friendly design (LFD) device for generating a parametric defect characteristic function.

In an example embodiment, the modification unit includes an index input section for inputting a pattern correction index that has a physical dimension substantially identical to that of the process characteristic parameter and is determined in accordance with the characteristic layout of the model pattern, a first operator for calculating a normalization factor of each fitting function with respect to a reference function using the pattern correction index, and a synthesizer for mathematically operating the reference function and the normalized fitting functions to thereby generate the general defect characteristic function, one of the defect characteristic functions being selected as the reference function and remaining defect functions except for the reference function being selected as the fitting functions.

In an example embodiment, the normalization factor of each fitting function includes a ratio of functional values of each of the fitting functions with respect to a functional value of the reference function at the pattern correction index, and the general defect characteristic function is generated by an arithmetical summation of the reference function and normalized fitting functions, each of the normalized fitting functions including a multiplication of each of the fitting functions by the normalization factor.

In an example embodiment, the modification unit includes a detection section for detecting the process characteristic value from an object pattern that is a portion of the design pattern and has a layout substantially identical to that of the model pattern corresponding to the process failure types, a second operator for calculating an actual defect frequency of the object pattern as a first functional value of the general defect characteristic function at the process characteristic value, and an optimal defect frequency of the object pattern as a second functional value of the general defect characteristic function at the pattern correction index, a comparator for comparing the actual defect frequency and the optimal defect frequency with each other, and a modification section for determining a correction amount of the process characteristic value of the object pattern using the pattern correction index. For example, the correction amount of the correction amount of the process characteristic value of the object pattern includes a difference between the process characteristic value and the pattern correction index.

According to the present invention, normalization factors among a random defect, a systematic defect and a parametric defect that are independent from one another are determined and a general defect characteristic function is generated by using the normalization factors. A design pattern is modified in such a manner that a process characteristic parameter of the design pattern corresponds to that of the general defect characteristic function at a minimal point thereof, to thereby increase the product yield of the integrated circuit. Further, a modification error to the design pattern due to manual inaccuracy of a design engineer may be sufficiently prevented and a process engineer may share correction criteria for the design pattern in common with the design engineer.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
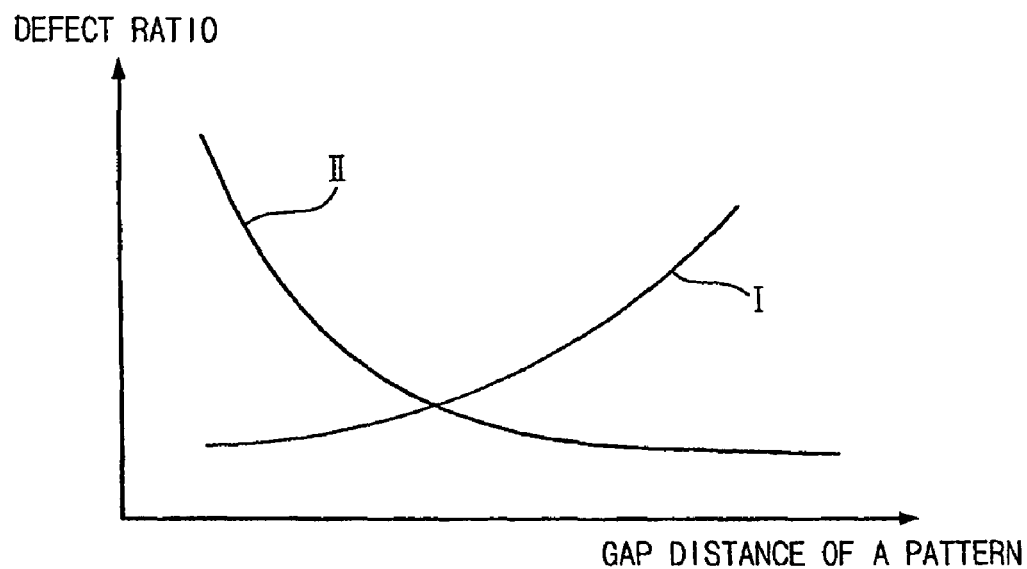
FIG. 1 is a graph illustrating a characteristic function of each type of defect generated by a conventional design for manufacturability (DFM) tool.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Automatically Correcting a Design Pattern

Figure 2A:
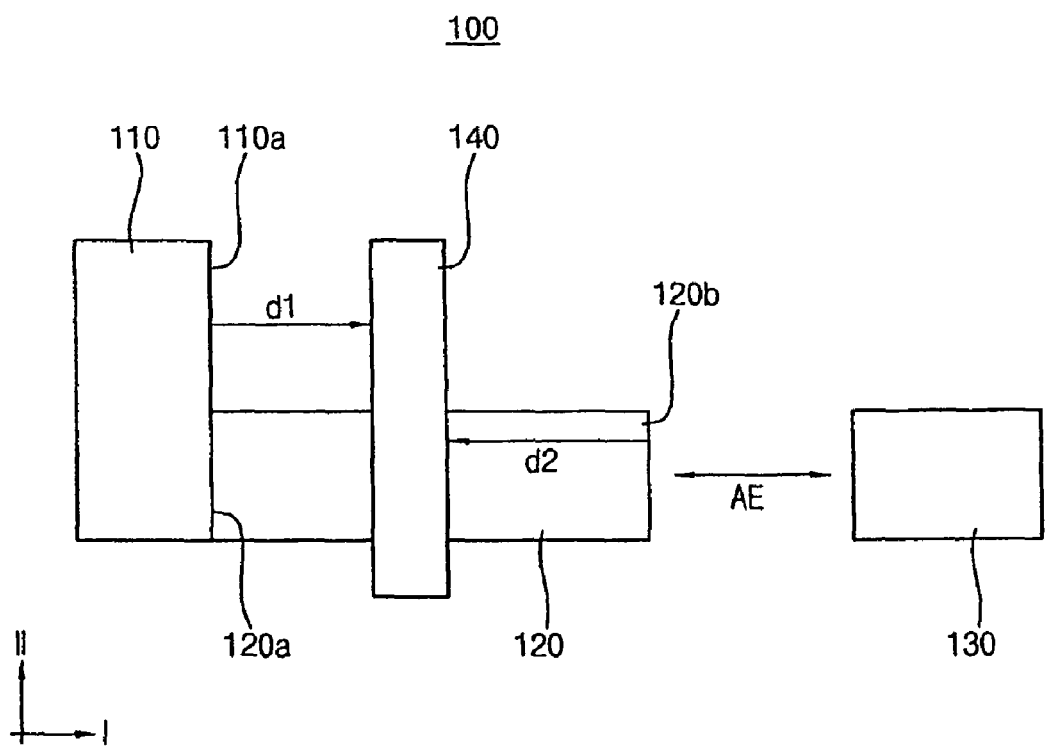
FIG. 2A is a plan view illustrating an exemplary design pattern that is to be transcribed onto a wafer through a correction method in accordance with an example embodiment of the present invention.
Figure 2B:
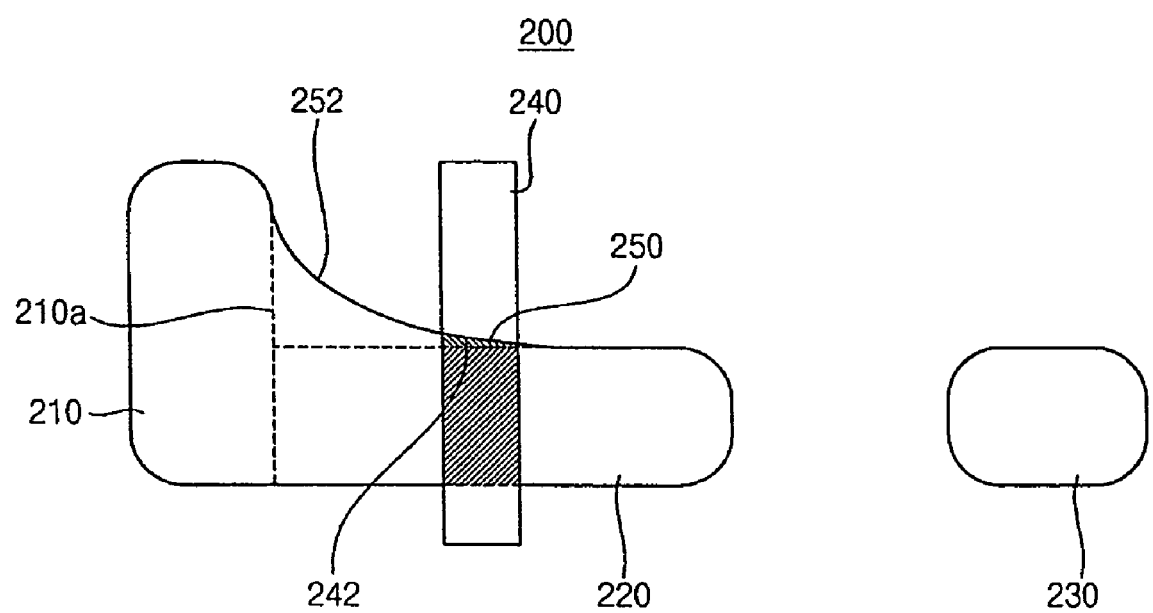
FIG. 2B is a plan view illustrating a practical pattern that is transcribed from the design pattern in FIG. 2A.

FIG. 2A is a plan view illustrating an exemplary design pattern that is to be transcribed onto a wafer through a correction method in accordance with an example embodiment of the present invention, and FIG. 2B is a plan view illustrating a practical pattern that is transcribed from the design pattern in FIG. 2A.

Referring to FIG. 2A, the exemplary design pattern 100, which is a mother pattern of the practical pattern in FIG. 2B, may include a first pattern 110 that is transcribed onto a first layer of a substrate (not shown), a second pattern 120 making contact with a first sidewall 110a and extending from the first pattern 110 in a first direction I on the first layer, a third pattern 130 spaced apart from the second pattern 120 by an allowable error AE on the first layer, and a fourth pattern 140 spaced apart from the first sidewall 110a of the first pattern 110 by a first gap distance d1 and from a second sidewall 120b of the second pattern 120 by a second gap distance d2.

In an example embodiment, the first pattern 110 may include a conductive structure on the substrate such as a wafer and the second pattern 120 may include a first active region making contact with the conductive structure. The third pattern 130 may include a contact area adjacent to the first active region, and the fourth pattern 140 may include a polysilicon line in the first active region. For example, the fourth pattern may include a gate line in the active region of the wafer. In the present embodiment, the design pattern is directed to transcribe a gate electrode of a semiconductor device onto an overlap area between the second and fourth patterns 120 and 140.

The design pattern 100 may not be accurately transcribed onto the substrate due to various processing conditions. For example, each corner portion of the design pattern 100 may not be accurately transcribed onto the substrate by processing limitations, such as an optical proximity effect, and is practically transcribed into a round shape as shown in FIG. 2B. Particularly, the first sidewall 110a of the first pattern 110 makes contact with the first sidewall 120a of the second pattern 120, and the first pattern 110 has a relatively larger thickness that the second pattern 120 in a second direction II vertical to the first direction I. Therefore, the first and second patterns 110 and 120 may have the largest thickness difference in the second direction II than any other thickness differences among the first, second, third and fourth patterns 110, 120, 130 and 140 when making contact with each other. As a result, the corner portion at which the first sidewall 110a of the first pattern 110 and the first sidewall 120a of the second pattern 120 make contact with each other may be transcribed into the largest curvature compared with any other corner portions in the design pattern 100, which is designated as reference numeral 252 in FIG. 2B.

Accordingly, a second process pattern 220 of the practical pattern 200, which is transcribed from the second pattern 120 of the design pattern 100, has a larger area than the second pattern 120 of the design pattern 100, so that the second process pattern 220 overlaps with the fourth process pattern 240 at a larger area than the second and fourth patterns 120 and 140 of the design pattern 100. That is, an overlap area between the second and fourth process patterns 220 and 240 further includes an additional area 250. The process pattern 240 on the additional area 250 functions as a defect source in operating the semiconductor device. Hereinafter, the fourth process pattern 240 on the additional area 250 will be referred to as an additional pattern 242.

In the present embodiment, the fourth process pattern 240 in the second process pattern 220 functions as a gate electrode in the active region of the substrate, so that the additional pattern 242 may function as an additional gate electrode which is not expected in designing the design pattern 100. For example, the additional gate electrode generates a leakage current to a region which is designed to be a field region, to thereby generate operation failures of the semiconductor device.

When the fourth process pattern 240 is positioned relatively adjacent to a first process pattern 210 that is transcribed from the first pattern 110, the size of the additional area 250 is relatively large, and thus the semiconductor device including the additional pattern 242 may not work due to a large leakage current. However, when the fourth process pattern 240 is positioned relatively apart from the first process pattern 210, the size of the additional area 250 is relatively small, and thus the leakage current from the additional pattern 242 may not be sufficient to cause a malfunction of the semiconductor device. That is, in this case, the leakage current merely reduces the efficiency of the semiconductor device, and may not cause the operation failure of the semiconductor device. Accordingly, control on the first gap distance d1 between the first and fourth patterns 110 and 140 may sufficiently minimize the parametric defects of the practical pattern 200.

In the present embodiment, a second gap distance d2 between a second sidewall 120b of the second pattern 120 and the fourth pattern 140 needs to be a constant in the manufacturing process, so that the increase of the first gap distance d1 necessarily causes the reduction of the allowable error AE between the second and third patterns 120 and 130.

The reduction of the allowable error AE usually causes an increase of the random defects generated from arbitrary particles between the second and third patterns 120 and 130 and an increase of the systematic defects generated from the accuracy of transcription of the design pattern 100.

Therefore, the first gap distance d1 may be controlled in such a manner to prevent the efficiency decrease of the semiconductor device due to the parametric defects at the expense of the increase of the random defects and the systematic defects. A conventional design for manufacturability (DFM) process allows the first gap distance d1 for optimizing the different kinds of the defects to be found based on the personal experience of the engineers. In contrast, the DFM process in accordance with an example embodiment of the present invention allows the first gap distance d1 to be found by an automatic method such as a computer simulation.

Hereinafter, a method of automatically correcting a design pattern for minimizing the different kinds of the defects will be described in detail. In an example embodiment, an automatic method of determining the optimal value of the first gap distance d1 is exemplarily described based on the design pattern and the practical pattern shown in FIGS. 2A and 2B. However, the following method may not be limited to the design and practical patterns and to the above-mentioned defects, but may be applied in the same way despite other defects and other design and practical patterns which are different from the patterns shown in FIGS. 2A and 2B, as would be known to one of ordinary skill in the art.

Figure 3:
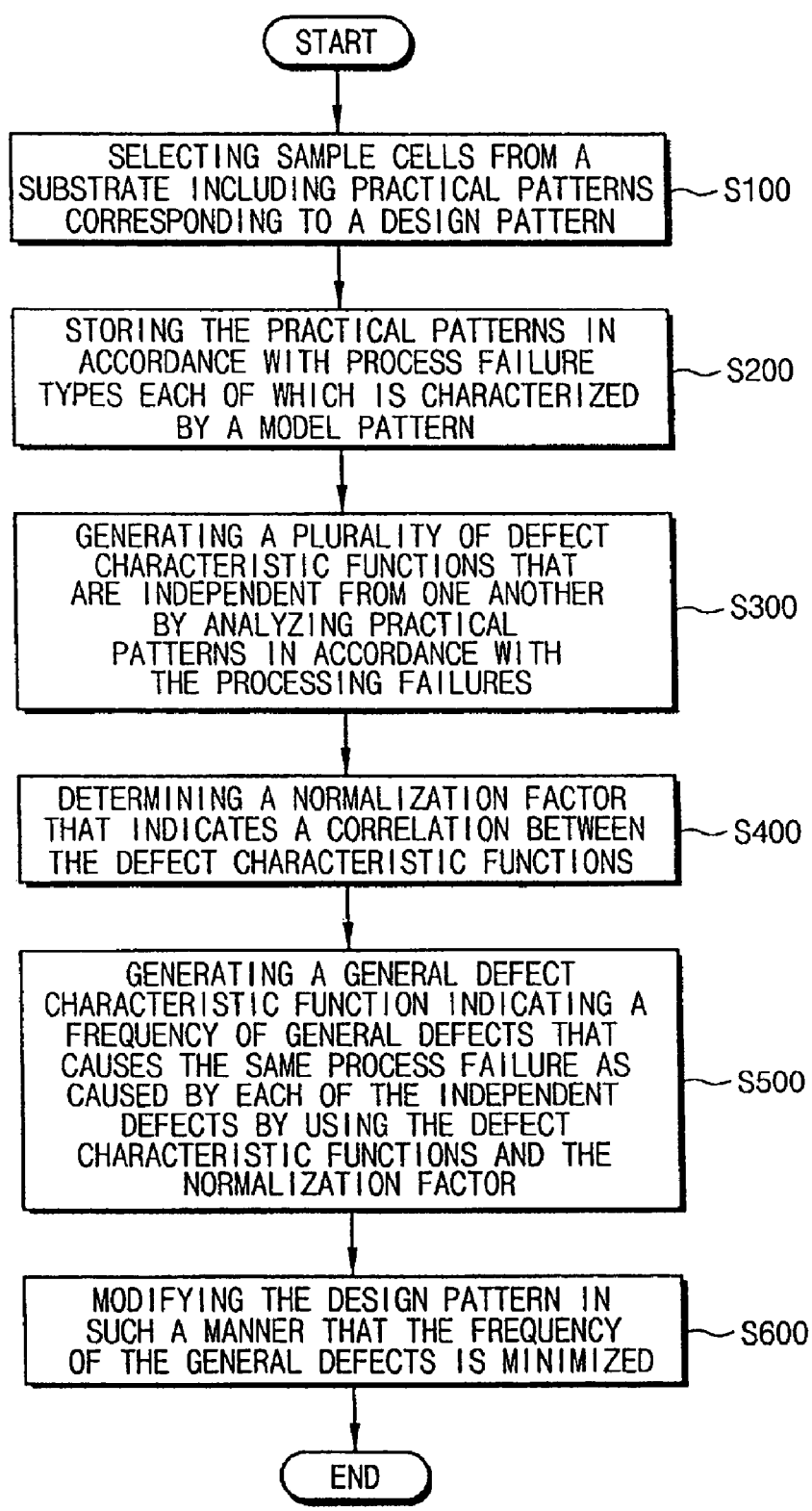
FIG. 3 is a flowchart illustrating a method of automatically correcting a design pattern for minimizing the different kinds of the defects in accordance with an example embodiment of the present invention.

FIG. 3 is a flowchart illustrating a method of automatically correcting a design pattern for minimizing the different kinds of the defects in accordance with an example embodiment of the present invention.

Referring to FIGS. 2A, 2B and 3, a unit process for manufacturing a semiconductor device is performed on the substrate using the design pattern 100, to thereby form the practical patterns 200 on cells of the substrate. Then, some of the cells are selected as sample cells from the substrate for inspecting the processing defects of the unit process (step S100).

Various practical patterns 200 are formed on the substrate by transcription of the design pattern 100 in the unit process. For example, the unit process may include a gate process for forming switch transistors on the substrate, a contact process for forming a contact penetrating an insulation interlayer and a wiring process for forming a metal wiring on the substrate including the transistors and the contacts. The above practical patterns may include various kinds of processing defects in accordance with processing conditions such as temperature and pressure and processing environments such as layout characteristics. Examples of the processing defects in the practical patterns may include reduction of widths of and/or gap distances between the conductive structures such as the gate or the contact, reduction of overlap margin of two contact members, increase of the leakage current from the gate electrode and increase of a parasitic capacitance at a capacitor. The processing defect of the reduction of the widths of and distances between the conductive structures may be frequently generated in a process of forming a gate electrode, and the processing defect of the reduction of the overlap margin or misalignment of lines may be frequently generated in a process of forming the contact. In addition, the smaller the critical dimensions (CDs) are, the more the practical pattern is generated. Further, the simpler the shape of the design pattern is or the longer the gap distance of the design pattern is, the less the practical pattern is generated. Therefore, the practical pattern on the substrate may include various processing defects in accordance with a kind of the unit process, the processing conditions and the layout of the design pattern, and the processing defects are uniformly distributed on the whole surface of the substrate. A plurality of cells is formed on an effective area of the substrate by the unit process and is classified into a number of groups in accordance with an operation unit, and each of the groups will hereinafter be referred to as a library cell.

In an example embodiment, the library cell is defined as an inspection area and the cells in the inspection area are selected as sample cells. Then, all of the sample cells are inspected and analyzed in an analysis process, to thereby reveal the kind, location, type and frequency of the processing defects in the sample cells. Thereafter, various practical patterns in the sample cells are sorted in accordance with the kind of the defect and are grouped into failure types, each of which is matched with a design pattern. Then, the failure types are stored in a storing member (step S200). Hereinafter, the design pattern that is matched with the failure types will be referred to as a model pattern.

Various process failures of each unit process are grouped into the failure types based on accumulated empirical data of each unit process, and a typical design pattern of which the layout has much effect on the generation of the process failures is designated one-to-one to each of the failure types. The failure types may include an insufficient overlap between two contact members, a leakage current from a gate electrode, a parasitic capacitance of a capacitor, an electrical short at a conductive line and a void in an insulation interlayer. The design pattern corresponding to the detected process failure has a layout that is supposed to generate the process failure based on the accumulated empirical data and interrelations between various detected process failures and the layout of the design patterns.

In an example embodiment, the practical patterns of the sample cells are compared with the model patterns corresponding to each of the process failures. When the layout of the practical pattern is similar to that of a specific model pattern, the practical pattern is recognized in that the process failure corresponding to the specific model pattern is likely to be measured in the practical pattern and is stored in the storage unit in relation with the processing unit.

Then, the practical patterns sorted in accordance with each of the process failures are analyzed in a DFM tool, to thereby generate a defect characteristic function. The defect characteristic function gives some information on frequencies of various processing defects which are independent of and different from one another and each of which has a decisive effect on the specific process failure (step S300).

In an example embodiment, the practical patterns stored in each of the failure types are analyzed by various DFM tools. The processing defects that cause the process failures corresponding to each of the failure types are classified into the random defect, the systematic defect and the parametric defect, and each type of processing defect is analyzed by a corresponding DFM tool. For example, a CAA device may be used for analyzing the random defects, and a CFA device may be used for analyzing the systematic defects. In addition, a LFD device may be used for analyzing the parametric defects. While the present example embodiment describes the above DFM tools in view of each type of the processing defects, other DFM tools may be used for analyzing the processing defects for the sake of convenience and processing conditions, as would be known to one of ordinary skill in the art.

The processing defects in the sample cells may be different in accordance with processing conditions and the layout of the design pattern. However, in the present example embodiment, there is exemplarily described a method of correcting the design pattern 100 in FIG. 2A based on the analysis of the practical pattern 200 in FIG. 2B including the processing defects such as the width and/or the gap distance defects. That is, the process failures measured in FIGS. 2A and 3B include a leakage current from the additional pattern and an electrical short due to the reduction of the allowable error AE, and the processing defects causing the above process failures include a gap distance between the first, second, third and fourth process pattern of the practical pattern 200 and a gap distance between the second process pattern and the third process pattern.

The processing defects of the gap distance and the gap space in the practical pattern 200 may be classified into the parametric defect that causes a performance decrease of the semiconductor device due to the leakage current between the first and fourth process patterns 210 and 240, the random defect such as a particle between the second and third process patterns 220 and 230 and the systematic defect caused by the reduction of the allowable error AE.

A physical quantity of the practical pattern 200 that has a decisive effect on the process failure corresponding to the failure types is selected as a process characteristic parameter of a unit process for forming the practical pattern. Since the practical pattern is very similar to the model pattern in a view of the layout thereof, the modification of the layout of the model pattern in view of the process characteristic parameter for the practical pattern may have a remarkable effect on the process failures corresponding to the failure type.

The processing defects in the practical patterns are analyzed by the various DFM tools, to thereby obtain a binary distribution between the process characteristic parameter and the processing defects in the practical patterns. In an example embodiment, the processing defects in the practical patterns 200 are analyzed by the respective DFM tools of the CM, CFA and LFD devices, to thereby obtain three binary distributions on the random defects, the systematic defects and the parametric defects, respectively. Each of the binary distributions may be formed into a continuous defect characteristic function by some statistical tools. The defect characteristic function shows the interrelations between the frequency of each process defect and the process characteristic parameter.

Figure 4:
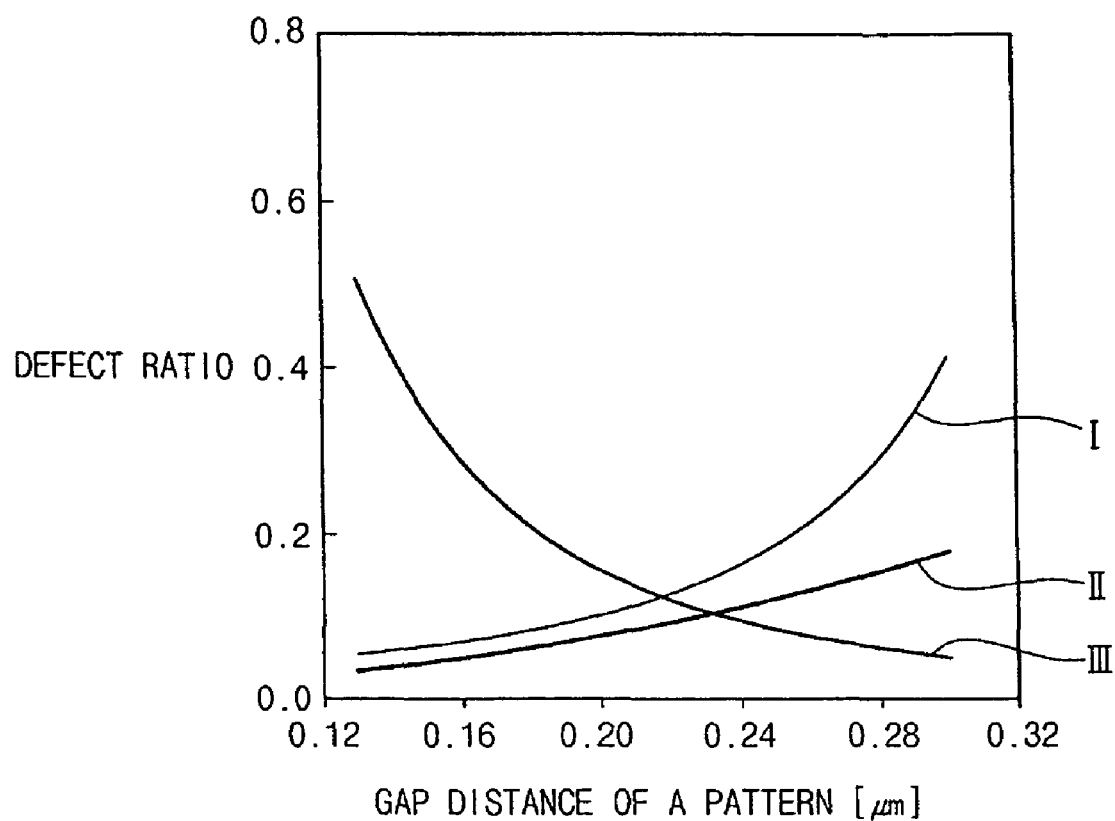
FIG. 4 is a graph illustrating curves of the defect characteristic function in accordance with an example embodiment of the present invention.

FIG. 4 is a graph illustrating curves of the defect characteristic function in accordance with an example embodiment of the present invention.

An independent variable of the defect characteristic function includes the process characteristic parameter, which is a particular physical quantity that may have a decisive effect on each type of the processing defects, and thus the independent variable of the defect characteristic function may be selected in accordance with the kind and type of the processing defects. Particularly, a specific process parameter of which the correlation with the processing defects is needed is selected as the process characteristic parameter, and the process characteristic parameter works as the independent variable of the defect characteristic function. For example, the defect characteristic function for a systematic defect in the contact may be a distance between the contact and an edge portion of the conductive layer as the independent variable, and the defect characteristic function for a random defect may be a gap distance of adjacent structures between which the particle is positioned as the independent variable.

In the present embodiment, since the second gap distance d2 between the second process pattern 220 and the fourth process pattern 240 needs to be constant, the processing defects in the practical pattern 200 is decisively determined by the first gap distance d1 or the allowable error AE. For that reason, the first gap distance d1 or the allowable error AE is selected as the process characteristic parameter and the independent variable of the defect characteristic function. In FIG. 4, the horizontal axis (the X-axis) indicates the first gap distance d1 and the vertical axis (the Y-axis) indicates a defect ratio or a device performance level measured by the DMF tools. Curve I is a defect characteristic function indicating the correlation between the first gap distance d1 and the random defect analyzed by CAA device, and Curve II is a defect characteristic function indicating the correlation between the first gap distance d1 and the systematic defect analyzed by CFA device. Further, Curve III is a defect characteristic function indicating the correlation between the first gap distance d1 and the parametric defect analyzed by LFD device.

Referring to FIG. 4, the parametric defect decreases while both the random defect and the systematic defect increase, as the first gap distance d1 increases. The larger the first gap distance d1 is, the smaller the additional pattern 242 is and thus the smaller the leakage current from the addition pattern 242 is. Accordingly, there is little chance of performance decrease in the semiconductor device due to the additional pattern as the first gap distance d1 increases. However, the allowable error AE between the second and third process patterns 220 and 230 is decreased as the first gap distance d1 increases, and thus there is sufficient chance that the particle between second and third process patterns 220 and 230 may work as the random defect. In addition, the process margin between the second and third process patterns 220 and 230 is also decreased as the allowable error AE between the second and third process patterns 220 and 230 decreases, and thus there is also sufficient chance of the systematic defect between second and third process patterns 220 and 230. In such cases, the random defects and the systematic defects are expressed as a percentage indicating a defect ratio, and the parametric defects are expressed in milliamperes (mA) indicating an intensity of the leakage current.

Figure 5:
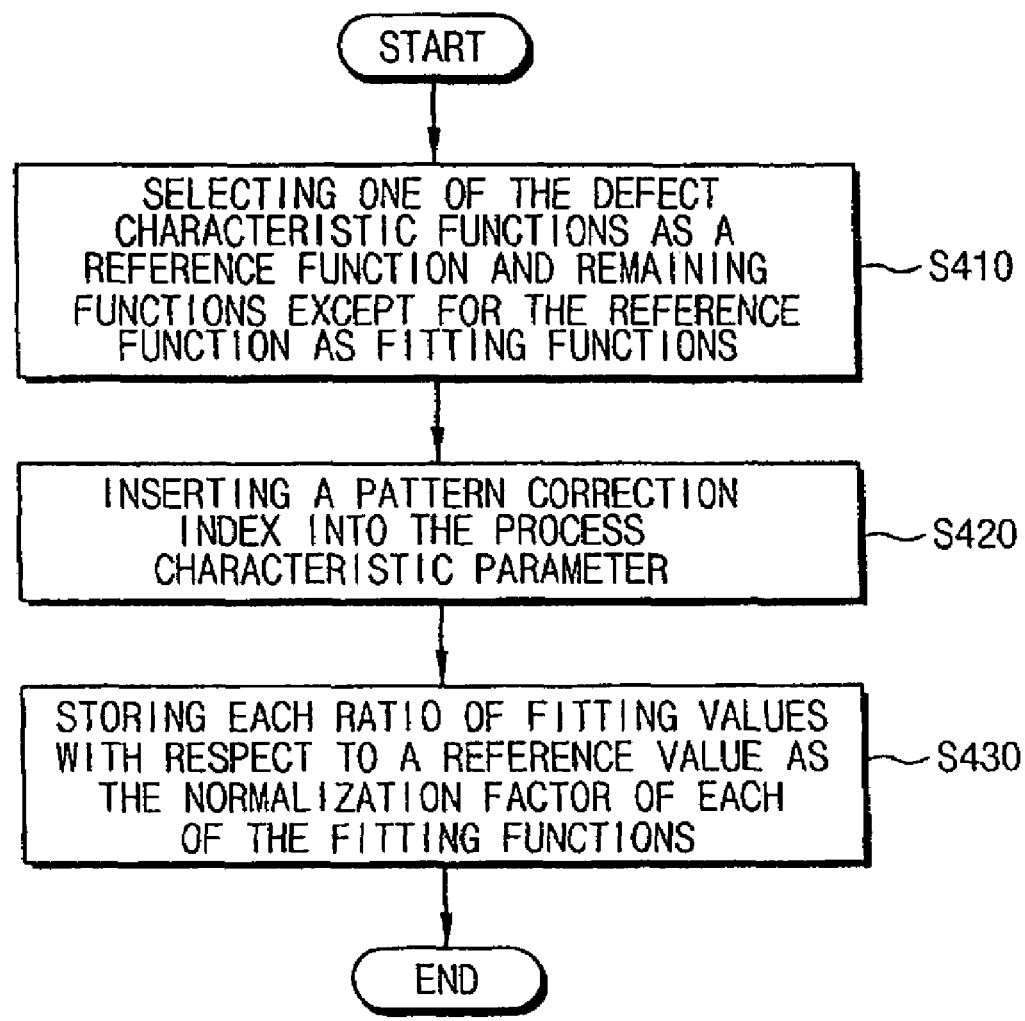
FIG. 5 is a detailed flowchart illustrating the processing step of determining the normalization factor shown in FIG. 3.

A normalization factor is determined for normalizing the independent defect characteristic functions of which the physical dimensions are different from one another into a single defect function (step S400). The normalization factor indicates a ratio of each defect characteristic function with respect to an arbitrary reference function, so that the normalization factor is a dimensionless parameter having no physical dimension. FIG. 5 is a detailed flowchart illustrating the processing step of determining the normalization factor shown in FIG. 3.

Referring to FIGS. 4 and 5, one of the defect characteristic functions is selected as the reference function, and the other functions are selected as fitting functions (step S410). In an example embodiment, Curve I indicating the random defect characteristic function is selected as the reference function, and Curve II and Curve III indicating the systematic defect characteristic function and the parametric defect characteristic function, respectively, are selected as the fitting functions.

Specifically, Curve I is fixed to be unmovable in a coordinate system in FIG. 4, and Curve II and Curve III are translated in parallel by a translation coefficient, respectively in such a manner that Curve I, Curve II and Curve III coincides at a point referred to as triple point. The translation coefficient for translating Curve II in such a manner that Curve II passes through the triple point is selected as the normalization factor of Curve II, and the translation coefficient for translating Curve III in such a manner that Curve III passes through the triple point is selected as the normalization factor of Curve III.

A plurality of the double points through which both Curve II and Curve III pass is positioned on Curve I, so that a pattern correction index, which is determined in accordance with the layout of the model pattern, is inserted into each of the defect characteristic functions (step S420) as the process characteristic parameter, to thereby uniquely fix the triple point among the double points on Curve I.

The pattern correction index is an eigenvalue of the model pattern corresponding to the failure type, and is determined by personal experience in view of the layout of the design pattern that is to be corrected through the DFM process and process limitations. That is, the pattern correction index includes an optimal value of the process characteristic parameter which may modify the layout of the model pattern in accordance with the empirical data in such a manner that the practical pattern that is transcribed from the modified model pattern has the smallest defect ratio, to thereby obtain the highest product yield of the semiconductor device. As a result, the pattern correction index indicates the process characteristic parameter for minimizing the defect ratio of a design pattern of which the layout is the same as that of the model pattern by intuition of the skilled engineers or the empirical data including previous analysis results. In the present example embodiment, the design pattern has an 'L'-shaped layout and the process limitation that the second gap distance d2 needs to be constant. Accordingly, the pattern correction index of the present embodiment may indicate the first gap distance d1 or the allowable error AE for minimizing the random defects, the systematic defects and the parametric defects in the practical pattern transcribed from the design pattern of which the layout is shaped into 'L' under the process limitation that the second gap distance d2 is maintained to be constant.

Then, the normalization factor of each fitting function is calculated with respect to the reference function using the pattern correction index and each normalization factor is stored in the storage unit (step S430).

In an example embodiment, a first ratio between the random defect characteristic function and the parametric defect characteristic function is calculated and stored into the storage unit as a first normalization factor M, and a second ratio between the random defect characteristic function and the systematic defect characteristic function is calculated and stored into the storage unit as a second normalization factor N. Therefore, the first normalization factor M indicates a dimensionless ratio between the performance of the semiconductor device and the random defect ratio in the practical pattern, and the second normalization factor N indicates a dimensionless ratio between the systematic defect ratio and the random defect ratio in the practical pattern.

Supposing that the random defect characteristic function is $f(x)$, the systematic defect characteristic function is $g(x)$, and the parametric defect characteristic function is $h(x)$ in FIG. 4, the first and second normalization factors M and N are expressed as the following expressions (1) and (2):

$$\frac{g(x)}{f(x)} = M \quad (1)$$

$$\frac{h(x)}{f(x)} = N \quad (2)$$

In addition, assuming the pattern correction index for the practical pattern 200 is about 0.23, the first and second normalization factors M and N are calculated as follows:

$$\frac{g(0.23)}{f(0.23)} = 1.5 = M$$

$$\frac{h(0.23)}{f(0.23)} = 0.8 = N$$

Then, the defect characteristic functions $f(x)$, $g(x)$ and $h(x)$ are normalized by the first and second normalization factors M and N, and are formed into a single general defect characteristic function (step S500). The single general defect characteristic function gives some information on the frequency of general defects which causes the process failures in the practical pattern 200 as if the process failures were simultaneously caused by the random, systematic and parametric defects (step S500). That is, the single general defect characteristic function may be obtained from Curve I, Curve II and Curve III using the first and second normalization factors M and N.

In an example embodiment, the general defect characteristic function may include an arithmetic summation of Curve I, Curve II and Curve III shown in FIG. 4. The normalized function of the systematic and parametric functions may be obtained by multiplication of the first and second normalization factors M and N thereto. Then, the reference and the normalized functions are arithmetically added to one another, to thereby generate the general defect characteristic function. As a result, the general defect characteristic function in case of the present example embodiment is expressed as the following expression (3):

$$A(x)=f(x)+1.5g(x)+0.8h(x) \quad (3)$$

As described above, the pattern correction index indicates an optimal value of the process characteristic parameter for minimizing the defect ratio of a design pattern of which the layout is the same as that of the model pattern under the processing limitations by intuition of the skilled engineers or the empirical data including previous analysis results. Accordingly, the general defect characteristic function indicates a general defect ratio on which the random, systematic and parametric defects have simultaneous effect with respect to the first gap distance d1 of the design pattern 100.

The general defect characteristic function of an arbitrary design pattern may be expressed as the following expression (4) based on expression (3).

$$A(x)=f(x)+Mg(x)+Nh(x) \quad (4)$$

Figure 6:
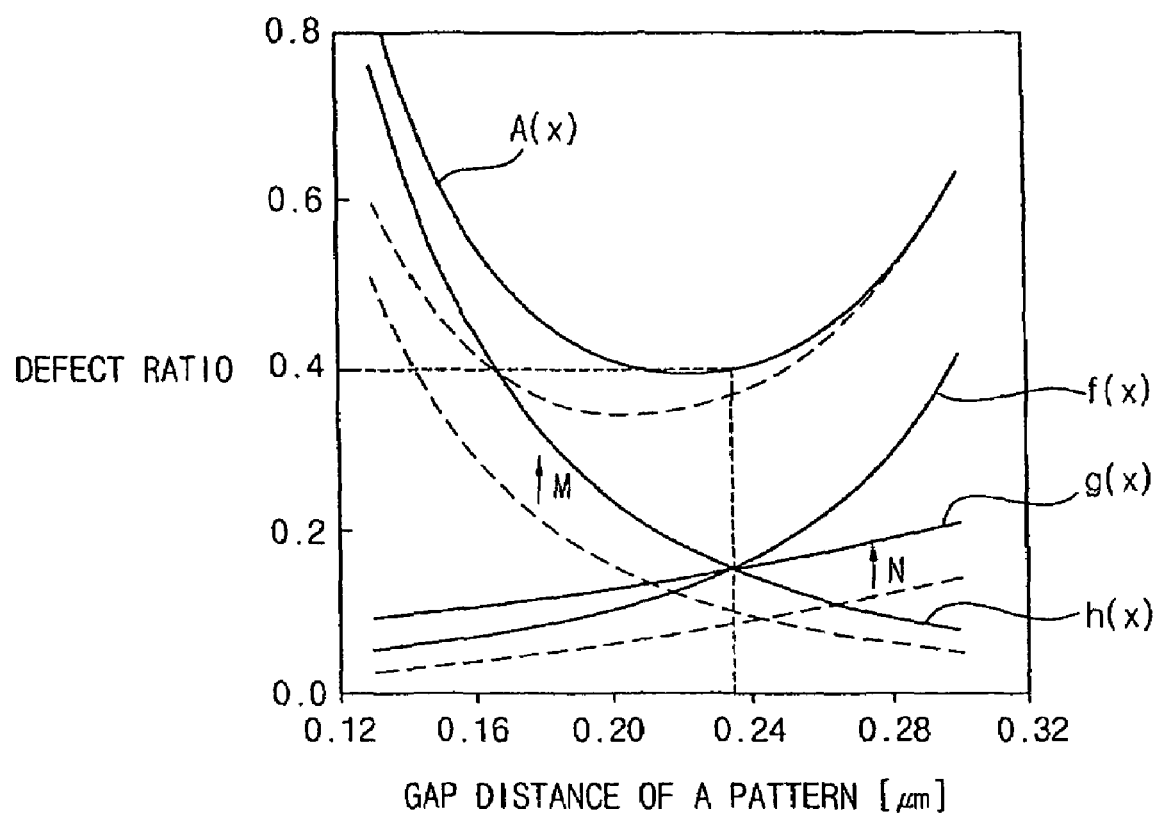
FIG. 6 is a graph illustrating curves of the general defect characteristic function based on the random defect characteristic function, the systematic defect characteristic function and the parametric defect characteristic function in FIG. 4.

FIG. 6 is a graph illustrating a curve of the general defect characteristic function based on the random defect characteristic function, the systematic defect characteristic function and the parametric defect characteristic function in FIG. 4.

Referring to FIG. 6, the general defect characteristic function $A(x)$ in the present example embodiment includes a quadratic function having a minimal point at the pattern correction index of about 0.23. Accordingly, when the first gap distance d1 is about 0.23 μm in the design pattern 100, the general defects are to be minimized in the practical pattern 200 of the sample cell on the substrate.

While the above example embodiment discloses an arithmetical sum of the reference and the normalized defect characteristic functions as the general defect characteristic function, any other kind of function known to one of ordinary skill in the art may also be used as the general defect characteristic function in accordance with a kind of the process failures and process defects causing the process failures, a correction of the process defects and other process limitations.

Figure 7:
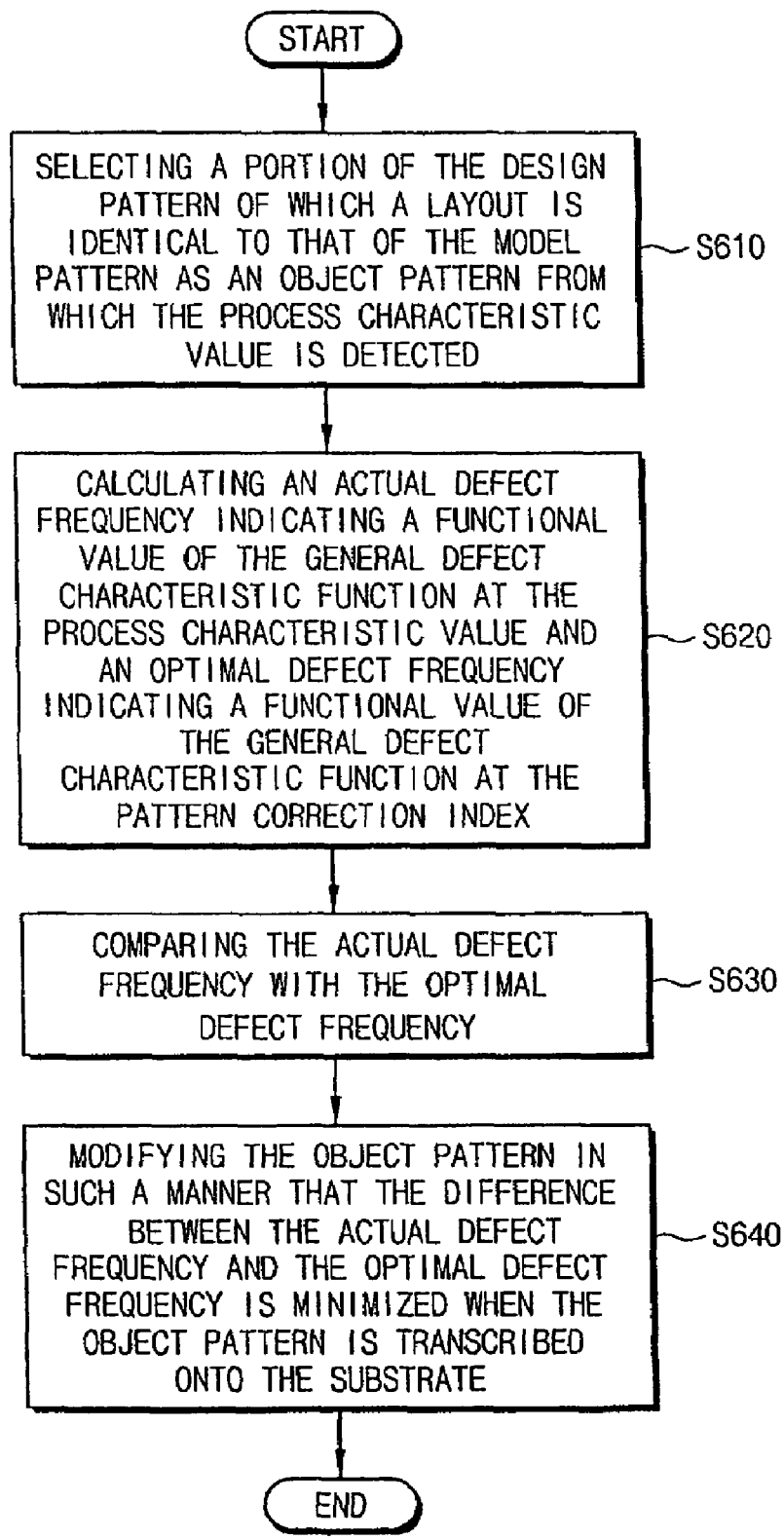
FIG. 7 is a flowchart illustrating a method of modifying the layout of the design pattern on the basis of the general defect characteristic function.

Then, the design pattern corresponding to the model pattern is evaluated on the basis of the general defect characteristic function, and the layout of the design pattern is modified to such a degree that the frequency of the general defects is minimized (step S600). FIG. 7 is a flowchart illustrating a method of modifying the layout of the design pattern on the basis of the general defect characteristic function.

Referring to FIG. 7, a portion of the design pattern of which the layout is substantially identical to that of the model pattern is selected as an object pattern that is to be corrected for minimizing the process defects, and determines a physical value of the process characteristic parameter (referred to as process characteristic value) by various measurement or detection tools (step S610). The design pattern is a mother pattern that is transcribed onto the whole library cell as well as the sample cells, and thus includes a circuit pattern that is to be transcribed into the practical pattern 200 on the sample cells of the substrate and other circuit pattern that is to be transcribed into other practical patterns on the other effective area of the substrate except for the sample cells. Therefore, the portion of the design pattern of which the layout is substantially identical to that of the model pattern is selected as the object pattern, and the process characteristic value is merely detected only from the object pattern.

A first numeric value of the general defect characteristic function corresponding to the process characteristic value is stored into the storage unit as an actual defect ratio, and a second numeric value of the general defect characteristic function corresponding to the pattern correction index is also stored into the storage unit as an optimal defect ratio (step S620), and the actual defect ratio and the optimal defect ratio are compared with each other (step S630). The actual defect ratio indicates an expected general defect ratio that is expected to be detected in an actual pattern, which is transcribed from the design pattern and includes the practical pattern 200 corresponding to the object pattern, supposing that the whole actual pattern is inspected and analyzed on the substrate. In contrast, the optimal defect ratio indicates an expected general defect ratio when the processing characteristic value of the object pattern is optimized by a process engineer's intuition and/or empirical data. That is, while the optimal defect ratio is based on a plurality of the practical patterns 200, all of which had already been transcribed onto a plurality of substrates from the same object pattern of the design pattern in previous days, the actual defect ratio is based on all of similar-practical patterns which are transcribed from similar-object patterns onto the same substrate. The similar-object pattern of the design pattern has a layout substantially identical to that of the object pattern, and the similar-practical pattern also has a layout substantially identical to that of the practical pattern 200 but is not actually inspected and analyzed by the DFM tools. In an example embodiment, when comparison results between the actual defect ratio and the optimal defect ratio is not allowable, the process characteristic value is modified into the pattern correction index at each of the object pattern and the similar-object patterns of the design pattern, to thereby correct the whole design pattern simultaneously in view of the general defects. As a result, when the modified design pattern is used as a mother pattern in a unit process, the general defect ratio may be minimized in the actual pattern on the whole substrate including the library cells, so that the random defect, the systematic defect and the parametric defect may be optimally minimized in the library cells.

Therefore, some portions of the design pattern, which is transcribed not into the sample cell but into the library cell of the substrate, may be automatically modified by using the general defect characteristic function. When a specific portion of the design pattern has the same layout and processing limitations as the object pattern corresponding to the practical pattern, the pattern correction index of the specific portion of the design pattern is substantially the same as that of the object pattern. Accordingly, the automatic modification of the portions of the design pattern having the same layout of the object pattern by using the general defect characteristic function may sufficiently prevent the correction errors to the design pattern by the design engineers. Further, the process engineers may check whether or not the modified design pattern is feasible based on the general defect characteristic function. Therefore, the design engineer and the process engineer may share correction criteria for correcting the design pattern in common.

For example, when the specific portion of the design pattern has the same layout as the object pattern and is transcribed to the library cells of the substrate under the same processing limitations as the practical pattern from the object pattern, the general defect ratio at the first gap distance of the specific portion of the design pattern is compared with a minimal value of the general defect characteristic function. The general defect ratio indicates the value of the general defect characteristic function at the point of the first gap distance of the specific portion of the design pattern, and the minimal value indicates the value of the general defect characteristic function at the point of the pattern correction index. When the general defect ratio is different from the minimal value out of an allowable process error range, all of the specific portion of the design pattern having the same layout as the object pattern is modified in such a manner that the difference between the first gap distance and the pattern correction index is decreased to be as small as possible, to thereby modify the whole design pattern. The above modification to the design pattern may be automatically performed by a computer system based on the general defect characteristic function. In addition, the criteria of the above modification may be shared in common by both the process and design engineers, to thereby improve the accuracy and efficiency of the modification process to the design pattern.

As a result, when the modified or corrected design pattern is transcribed onto the substrate, the process failures caused by the process defects corresponding to the practical pattern may be minimized, to thereby improve the product yield of the semiconductor device.

The above automatic modification to the design pattern may be performed with respect to all kinds of the process failures detected from the sample cells, and the general defect characteristic function may be obtained in accordance with each of the process failures. Accordingly, the whole design pattern may be modified using the general defect characteristic function with respect to each of the process failures, to thereby automatically modify all of the specific portions of the design pattern having the same layout as the object pattern for minimizing each of the process failures detected from the practical pattern.

In addition, the design engineer who modifies the design pattern, which is transcribed onto the whole substrate, based on the analysis data about the sample cells on a portion of the substrate, and the process engineer who reviews (DFM review) and checks the feasibility of the modified design pattern may share the same modification criteria in common, to thereby improve the efficiency of the DFM process and reduce time for the DFM review.

Apparatus for Automatically Correcting a Design Pattern

Figure 8:
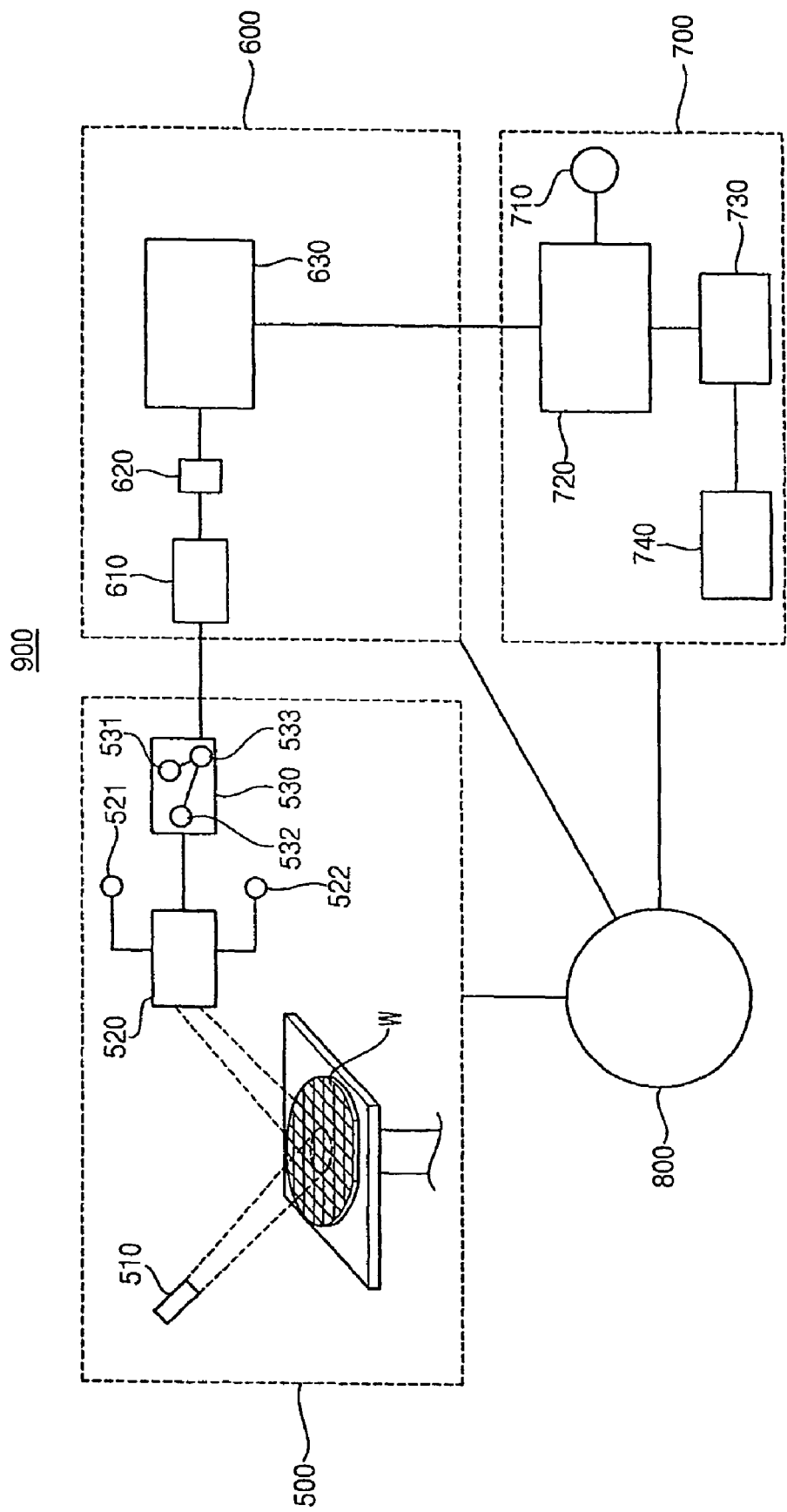
FIG. 8 is a schematic block diagram illustrating an apparatus for automatically correcting a design pattern in accordance with an example embodiment of the present invention.

FIG. 8 is a schematic block diagram illustrating a structure of an apparatus for automatically correcting a design pattern in accordance with an example embodiment of the present invention.

Referring to FIG. 8, an apparatus for automatically correcting a design pattern (hereinafter referred to as correction apparatus) 900 includes an analysis unit 500 for analyzing sample cells on a substrate and detecting processing defects from the sample cells to thereby generate defect characteristic functions which indicate frequencies of the processing defects. A portion of the design pattern is transcribed into the practical pattern in the sample cells of the substrate, and the detected processing defects may be classified into three defect groups that are independent from one another, so that the defect characteristic functions are generated in accordance with the independent defect groups. In an example embodiment, the defect characteristic functions may include a random defect characteristic function, a systematic defect characteristic function and a parametric defect characteristic function that are independent from one another. The correction apparatus 900 further includes a criteria generation unit 600 for generating a general defect characteristic function by processing the independent defect characteristic functions. The general defect characteristic function indicates a frequency of general defects that is expected to position in the practical pattern, and the general defect indicates a virtual defect simultaneously including the random, the systematic and the parametric defects. The correction apparatus 900 further includes a modification unit 700 for modifying the design pattern based on the general defect characteristic function and a control unit 800 for electrically controlling the analysis unit 500, the criteria generation unit 600 and the modification unit 700 to minimize the frequency of the general defects.

In an example embodiment, the analysis unit 500 includes a sampler 510 for defining sample cells from the practical patterns that are transcribed onto the substrate from the design pattern, a sorting member 520 for sorting the practical patterns in accordance with failure types, each of which corresponds to a model pattern, respectively. The model patterns are already classified in accordance with the process failures of the practical patterns and each of the model patterns has a characteristic layout. The analysis unit 500 also includes a function generator 530 for the defect characteristic functions with respect to the random defects, the systematic defects and the parametric defects that are independent from one another by analyzing the practical patterns that are sorted by the sorting member 520 in accordance with the failure types. As described above, the defect characteristic function indicates the frequency of each of the random defects, the systematic defects and the parametric defects, respectively.

In an example embodiment, the substrate W including the practical pattern is positioned on a top surface of a support, and the sampler 510 is positioned over the support. Therefore, the sampler 510 may define a portion of an arbitrary library cell on the substrate W by an optical process as the sample cells.

The practical pattern on the sample cells is provided into the sorting member 520, and is sorted in accordance with the process failure types. For example, the sorting member 520 may include a primary storage section 521 for storing the model patterns and a supplementary storage section 522 for the storing the practical pattern in accordance with the process failures. The model pattern in the primary storage section 521 includes the characteristic layout that uniquely characterizes a circuit pattern causing the most frequent process failures in a unit process. The practical patterns in the sample cells are compared with each of the model patterns, respectively, and are sorted and stored in accordance with the model patterns in the supplementary storage section 522. As a result, each layout of the sorted practical patterns corresponds to each of the processing units, respectively.

In an example embodiment, the function generator 530 may include a parameter input section 531 for inputting numerical values of a process characteristic parameter (process characteristic value) that has a critical effect on the process defect and thus functions as an independent variable of the defect characteristic function, an analyzer 532 for obtaining the frequency of each of the process random defects, the systematic defects and the parametric defects, respectively, in accordance with the process failure types, and an inference operator 533 for generating each of the random defect characteristic function, the systematic defect characteristic function and the parametric defect characteristic function based on the relationships between the process characteristic parameter and each of the process defects by a statistical inference process.

The analyzer 532 may include a CAA device for analyzing the relationships between the process characteristic parameter and the random defects that is randomly generated in a unit manufacturing process, a CFA device for analyzing the relations between the process characteristic parameter and the systematic defects that is caused by an insufficient transcription of the design pattern onto the substrate, and a LFD device for analyzing the relations between the process characteristic parameter and the parametric defects that causes a performance decrease of a semiconductor device.

In an example embodiment, a process characteristic value is inputted to the parameter input section 531 as the process characteristic parameter, and the analyzer 532 generates a discrete distribution indicating the relationships between the process characteristic value of the practical pattern that is sorted in accordance with the processing units and the defect ratio of each of the defects, respectively. Then, the inference operator 533 statistically operates each of the discrete distributions with respect to each of the random, systematic and parametric defects, respectively, to thereby generate a continuous defect characteristic function with respect to the random, systematic and parametric defects, respectively.

The criteria generation unit 600 may include an index input section 610 for inputting a pattern correction index that has the same physical dimension as the process characteristic parameter and is determined in accordance with the characteristic layout of the model pattern, a first operator 620 for calculating a normalization factor of each fitting function with respect to a reference function using the pattern correction index, and a synthesizer 630 for mathematically operating the reference function and the normalized fitting functions to thereby generate the general defect characteristic function. As described above, one of the defect characteristic functions is selected as the reference function, and the other functions are selected as fitting functions. For example, the random defect characteristic function may be selected as the reference function and the systematic and the parametric defect characteristic functions may be selected as the fitting functions.

In an example embodiment, the pattern correction index is provided into the index input section 610 by empirical data or intuition of skilled engineers, and the first operator calculates a reference value that is a functional value of the reference function with respect to the pattern correction index and fitting values that are functional values of the fitting functions with respect to the pattern correction index. In the present embodiment, the reference value, and first and second fitting values are calculated in the first operator 620. Then, a ratio of the first fitting value with respect to the reference value is calculated and stored in the first operator 620 as a first normalization factor and a ratio of the second fitting value with respect to the reference value is calculated and stored in the first operator 620 as a second normalization factor. Each fitting function is converted into a normalized function by some operations of the normalization factor and the corresponding fitting function, and the reference function and the normalized functions are operated with one another, to thereby generate a single general defect characteristic function in the synthesizer 630. In the present embodiment, the normalized function may be generated by the fitting function and the normalization factor corresponding thereto, and the general defect characteristic function may include an arithmetical sum of the reference function and the normalized functions.

In an example embodiment, the modification unit 700 may include a detection section 710 for detecting the process characteristic value from an object pattern which is a portion of the design pattern and has the same characteristic layout as that of the practical pattern that are sorted in accordance with the process failure types. In addition, the modification unit 700 may further include a second operator 720 for calculating an actual defect ratio and an optimal defect ratio with respect to the object pattern of the design pattern. The second operator 720 calculates a first numeric value of the general defect characteristic function corresponding to the process characteristic value, and stores the first numeric value as the actual defect ratio of the object pattern, and also calculates a second numeric value of the general defect characteristic function corresponding to the pattern correction index and stores the second numeric value as the optimal defect ratio of the object pattern. The modification unit 700 may further include a comparator 730 for comparing the actual defect ratio and the optimal defect ratio with each other, and a modification section 740 for determining a correction amount of the process characteristic value of the object pattern by using the pattern correction index.

In an example embodiment, when the difference between the actual defect ratio and the optimal defect ratio is out of an allowable process error range, the process characteristic parameter of the object pattern is corrected in a direction for decreasing the difference between the actual defect ratio and the optimal defect ratio, to thereby modify the layout of the object pattern of the design pattern. Some other portions of the design pattern of which the characteristic layout is the same as that of the object pattern that is actually transcribed into the practical pattern in the sample cells of the substrate may also be decisively influenced by the same process characteristic parameter, so that the above modification to the object pattern is applied to other portions of the design pattern having the same characteristic layout. As a result, the whole layout of the design pattern, which is a mother pattern for transcribing into the library cell on the substrate, may be simultaneously modified by the single general defect characteristic function and the pattern correction index. In addition, the modification process to the design pattern may be automatically performed because the base for the modification, the general defect characteristic function and the pattern correction index, is unique and single.

According to the example embodiments of the present invention, a general defect characteristic function including individual defect characteristic functions of which physical dimensions are different from one another is generated, and the whole layout of a design pattern, a mother pattern transcribed into all of the library cells of the substrate, may be automatically modified or corrected based on the general defect characteristic function. Therefore, a modification error to the design pattern due to manual inaccuracy of the design engineer may be sufficiently prevented and a process engineer may share correction criteria for the design pattern in common with a design engineer.

Although the example embodiments of the present invention have been described, it is understood that the present invention should not be limited to these example embodiments but various changes and modifications can be made by one skilled in the art within the spirit and scope of the present invention as hereinafter claimed.

What is claimed is:

1. A method of correcting a design pattern for an integrated circuit, comprising:

selecting a plurality of sample cells from a plurality of practical patterns on a substrate, the practical pattern being transcribed onto the substrate from a design pattern;

storing the practical patterns in accordance with process failure types, each of the process failure types being characterized by a model pattern;

generating a plurality of defect characteristic functions indicating frequencies of each of the defects that are independent from one another and cause the process failure by analyzing the practical patterns in accordance with the process failures;

determining a normalization factor that indicates a correlation between the defect characteristic functions;

generating a general defect characteristic function indicating a frequency of general defects that causes the same process failure as caused by each of the defects by using the defect characteristic functions and the normalization factor; and modifying the design pattern using a computer system in such a manner that the frequency of the general defects is minimized when at least one portion of the design pattern corresponding to the model pattern is transcribed on the substrate.

2. The method of claim 1, wherein selecting the sample cells includes defining an inspection area of a library cell, the library cell including a plurality of cells formed on an effective area of the substrate as an operation unit of the integrated circuit.

3. The method of claim 1, wherein storing the practical patterns in accordance with the process failure types includes:

comparing the practical patterns of the sample cells with the model pattern of each of the process failure units; and grouping the practical patterns in accordance with the model pattern of which a layout is substantially identical to that of the practical pattern.

4. The method of claim 3, wherein the process failure includes an insufficient overlap between contact members, a leakage current from a gate electrode, a parasitic capacitance at a capacitor, an electrical short at a conductive line and a void in an insulation interlayer, and the layout of the model pattern is inferred from empirical data on relationships between the process failures and the layout of the practical pattern.

5. The method of claim 1, wherein the practical patterns are analyzed by an apparatus for performing a design for manufacturability (DFM) process with respect to each of the process failure types, respectively.

6. The method of claim 5, wherein generating the defect characteristic functions includes:

selecting a physical quantity of the defects that have a decisive effect on the process failure as a process characteristic parameter;

obtaining a discrete distribution of each of the defects with respect to the process characteristic parameter of the practical pattern; and inferring a continuous function from the discrete distribution of each of the defects by a statistical inference process, respectively, to thereby generate the defect characteristic functions having the process characteristic parameter as an independent variable with respect to each of the defects.

7. The method of claim 6, wherein the process characteristic parameter includes a gap distance between structures on the substrate or an allowable error range in a unit process for manufacturing the integrated circuit.

8. The method of claim 6, wherein determining the normalization factor includes:

selecting one of the defect characteristic functions as a reference function and remaining functions except for the reference function as fitting functions;

inserting a pattern correction index into the process characteristic parameter, the pattern correction index being determined by the layout of the model pattern;

calculating a ratio of each of fitting values with respect to a reference value, the fitting values indicating functional values of each of the fitting functions at the pattern correction index and the reference value indicating functional values of each of the fitting functions at the pattern correction index; and storing each ratio of the fitting values with respect to the reference value as the normalization factor of each of the fitting functions.

9. The method of claim 8, wherein the pattern correction index includes a numerical value of the process characteristic parameter of the model pattern that minimizes the frequency of the general defects.

10. The method of claim 8, wherein generating the general defect characteristic function includes:

obtaining a normalized function in relation to each of the fitting functions by multiplying each fitting function by the normalization factor; and arithmetically summing the normalized function and the reference function.

11. The method of claim 8, wherein modifying at least one portion of the design pattern includes:

selecting a portion of the design pattern of which a layout is substantially identical to that of the model pattern as an object pattern that is to be corrected;

detecting a numerical value of the process characteristic parameter from the object pattern as a process characteristic value of the object pattern;

calculating an actual defect frequency indicating a functional value of the general defect characteristic function at the process characteristic value and an optimal defect frequency indicating a functional value of the general defect characteristic function at the pattern correction index;

comparing the actual defect frequency with the optimal defect frequency; and modifying the object pattern in such a manner that the difference between the actual defect frequency and the optimal defect frequency is minimized when the object pattern is transcribed onto the substrate.

12. The method of claim 5, wherein the defects that are independent from one another include a random defect that is randomly caused according to variation of process environments, a systematic defect caused by an insufficient transcription of the design pattern and a parametric defect due to a performance decrease of the integrated circuit by the insufficient transcription of the design pattern.

13. The method of claim 12, wherein the frequency of the random defects and the frequency of the systematic defects are represented by a dimension of percentage and the frequency of the parametric defect is represented by dimensions of a current intensity and a voltage.

14. The method of claim 12, wherein the apparatus for performing the DMF process includes a critical area analysis (CAA) device for generating a random defect characteristic function, a critical feature analysis (CFA) device for generating a systematic defect characteristic function and a litho-friendly design (LFD) device for generating a parametric defect characteristic function.

15. An apparatus for correcting a design pattern for an integrated circuit, comprising:
   an analysis unit that generates a plurality of defect characteristic functions indicating frequencies of each of the defects that are independent from one another by analyzing a plurality of sample cells including a plurality of practical patterns on a substrate, the practical patterns being transcribed onto the substrate from a design pattern and being sorted in accordance with process failure types, and each of the process failure types being characterized by a model pattern;
   a criteria generation unit for determining a normalization factor and generating a general defect characteristic function indicating a frequency of general defects that causes the same process failure as caused by processing the defect characteristic functions that are independent from one another and the normalization factor;
   a modification unit for modifying the design pattern based on the general defect characteristic function; and
   a control unit for electrically controlling the analysis unit, the criteria generation unit and the modification unit to minimize the frequency of the general defects.

16. The apparatus of claim 15, wherein the analysis unit includes a sampler for selecting sample cells including the practical patterns from the substrate that are transcribed from the design pattern, a sorting member for sorting the practical patterns in accordance with failure types, each of which corresponds to a model pattern having a characteristic layout, respectively, and a function generator for generating the defect characteristic functions with respect to the defects that are independent from one another by analyzing the practical patterns that are sorted by the sorting member in accordance with the failure types.

17. The apparatus of claim 16, wherein the sorting member may include a primary storage section for storing the model patterns and a supplementary storage section for the storing the practical pattern in accordance with the process failures.

18. The apparatus of claim 17, wherein the function generator includes a parameter input section for inputting numerical values of a process characteristic parameter as a process characteristic value that has a critical effect on the process defect, an analyzer for obtaining the frequency of each of the process defects, respectively, in accordance with the process failure types, and an inference operator for generating each of the defect characteristic functions based on the relations between the process characteristic parameter and each of the process defects by a statistical inference process.

19. The apparatus of claim 18, wherein the analyzer includes a CAA device for generating a random defect characteristic function, a CFA device for generating a systematic defect characteristic function and an LFD device for generating a parametric defect characteristic function.

20. The apparatus of claim 18, wherein the modification unit includes an index input section for inputting a pattern correction index that has a physical dimension substantially identical to that of the process characteristic parameter and is determined in accordance with the characteristic layout of the model pattern, a first operator for calculating a normalization factor of each fitting function with respect to a reference function using the pattern correction index, and a synthesizer for mathematically operating the reference function and the normalized fitting functions to thereby generate the general defect characteristic function, one of the defect characteristic functions being selected as the reference function and remaining defect functions except for the reference function being selected as the fitting functions.

21. The apparatus of claim 20, wherein the normalization factor of each fitting function includes a ratio of functional values of each of the fitting functions with respect to a functional value of the reference function at the pattern correction index, and the general defect characteristic function is generated by an arithmetical summation of the reference function and normalized fitting functions, each of the normalized fitting functions including a multiplication of each of the fitting functions by the normalization factor.

22. The apparatus of claim 18, wherein the modification unit includes a detection section for detecting the process characteristic value from an object pattern that is a portion of the design pattern and has a layout substantially identical to that of the model pattern corresponding to the process failure types, a second operator for calculating an actual defect frequency of the object pattern as a first functional value of the general defect characteristic function at the process characteristic value and an optimal defect frequency of the object pattern as a second functional value of the general defect characteristic function at the pattern correction index, a comparator for comparing the actual defect frequency and the optimal defect frequency with each other, and a modification section for determining a correction amount of the process characteristic value of the object pattern using the pattern correction index.

23. The apparatus of claim 22, wherein the correction amount of the correction amount of the process characteristic value of the object pattern includes a difference between the process characteristic value and the pattern correction index.

* * * * *